(12) United States Patent
Weinschenk

(10) Patent No.: US 9,252,085 B2
(45) Date of Patent: Feb. 2, 2016

(54) PACKAGE FOR AN INTEGRATED CIRCUIT

(71) Applicant: NXP B.V., Eindhoven (NL)

(72) Inventor: Christian Weinschenk, Arnhem (NL)

(73) Assignee: Samba Holdco Netherlands B.V., Eindhoven (NL)

( * ) Notice: Subject to any disclaimer, the term of this patent is extended or adjusted under 35 U.S.C. 154(b) by 0 days.

(21) Appl. No.: 14/077,138

(22) Filed: Nov. 11, 2013

(65) Prior Publication Data

US 2014/0131899 A1    May 15, 2014

(51) Int. Cl.
| | |
|---|---|
| H01L 21/00 | (2006.01) |
| H01L 23/49 | (2006.01) |
| H01L 21/56 | (2006.01) |
| H01L 23/00 | (2006.01) |
| H01L 23/31 | (2006.01) |

(52) U.S. Cl.
CPC .............. *H01L 23/49* (2013.01); *H01L 21/56* (2013.01); *H01L 23/315* (2013.01); *H01L 24/42* (2013.01); *H01L 23/3121* (2013.01); *H01L 2224/48091* (2013.01); *H01L 2224/48137* (2013.01); *H01L 2224/48247* (2013.01); *H01L 2924/181* (2013.01)

(58) Field of Classification Search
CPC ........... H01L 2224/48247; H01L 2224/48091; H01L 23/3121; H01L 2224/48137; H01L 23/315; H01L 23/49; H01L 24/42; H01L 21/56
USPC .......................................... 438/124; 257/784
See application file for complete search history.

(56) References Cited

U.S. PATENT DOCUMENTS

| | | | |
|---|---|---|---|
| 7,651,891 B1* | 1/2010 | Nguyen ..................... 438/127 |
| 2002/0081787 A1 | 6/2002 | Kohl et al. | |
| 2003/0151133 A1* | 8/2003 | Kinayman et al. ........... 257/713 |
| 2007/0273013 A1 | 11/2007 | Kohl et al. | |
| 2008/0191336 A1 | 8/2008 | Tsai | |
| 2008/0272475 A1* | 11/2008 | Dijkstra et al. ............... 257/682 |
| 2009/0001614 A1* | 1/2009 | Condie et al. ................ 257/795 |
| 2009/0294931 A1* | 12/2009 | Sham et al. ................... 257/660 |
| 2010/0252923 A1 | 10/2010 | Watanabe et al. | |

FOREIGN PATENT DOCUMENTS

| | | |
|---|---|---|
| EP | 0 930 644 A1 | 7/1999 |
| JP | 62-113433 | 5/1987 |

OTHER PUBLICATIONS

Reed et al., ("Reed") "Compliant Wafer Level Package (CWLP) with embedded air-gaps for sea of . . . ", Proceedings of the IEEE Int'l Interconnect Technology Conf., pp. 151-153, (2001).*
Spencer, et.al., "Decomposition of poly(propylene carbonate) with UV sensitive . . . ", Polymer Degradation and Stability, vol. 96, pp. 686-702 (2011).*
Extended European Search Report for Patent Appln. No. 12192281.9 (May 13, 2013).

* cited by examiner

*Primary Examiner* — A. Sefer

(57) ABSTRACT

The invention refers to method for packaging an integrated circuit (IC) comprising steps of:
  attaching at least one die on a substrate;
  attaching bond-wires from the die(s) to package terminal pads;
  mold or dispense a thermo-degradable material on the substrate, die(s) and bond-wires;
  mold an encapsulant material;
  decompose the thermo-degradable materials by temperature treatment.

19 Claims, 4 Drawing Sheets

Overmolded buried air cavity lead-frame based package for RF devices

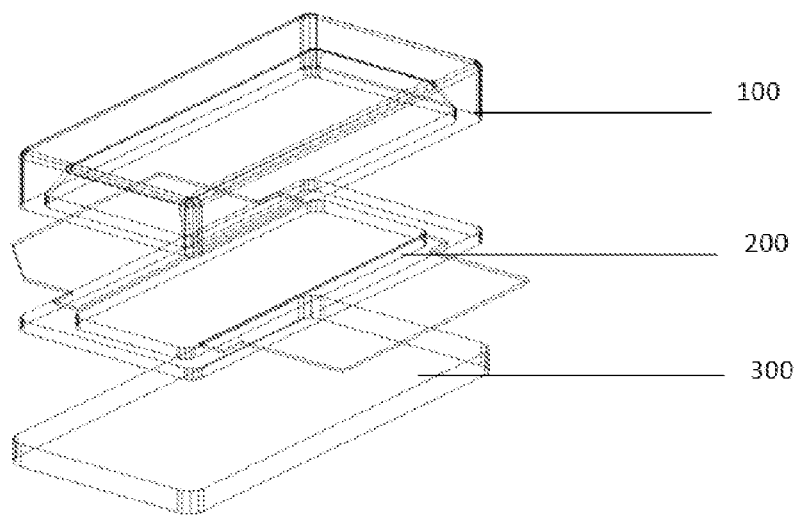
Fig. 1 General air cavity package for RF power amplifier
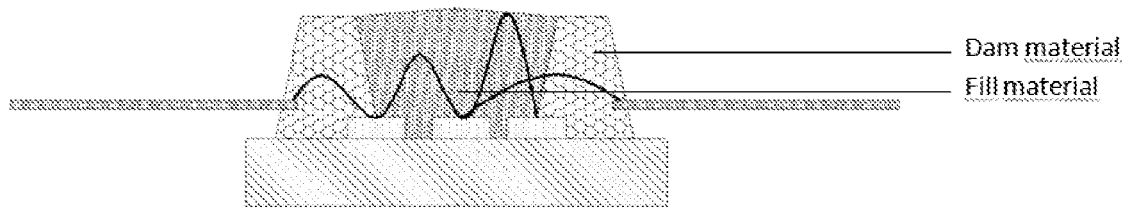
Fig. 2 A more detailed view of a packaged device

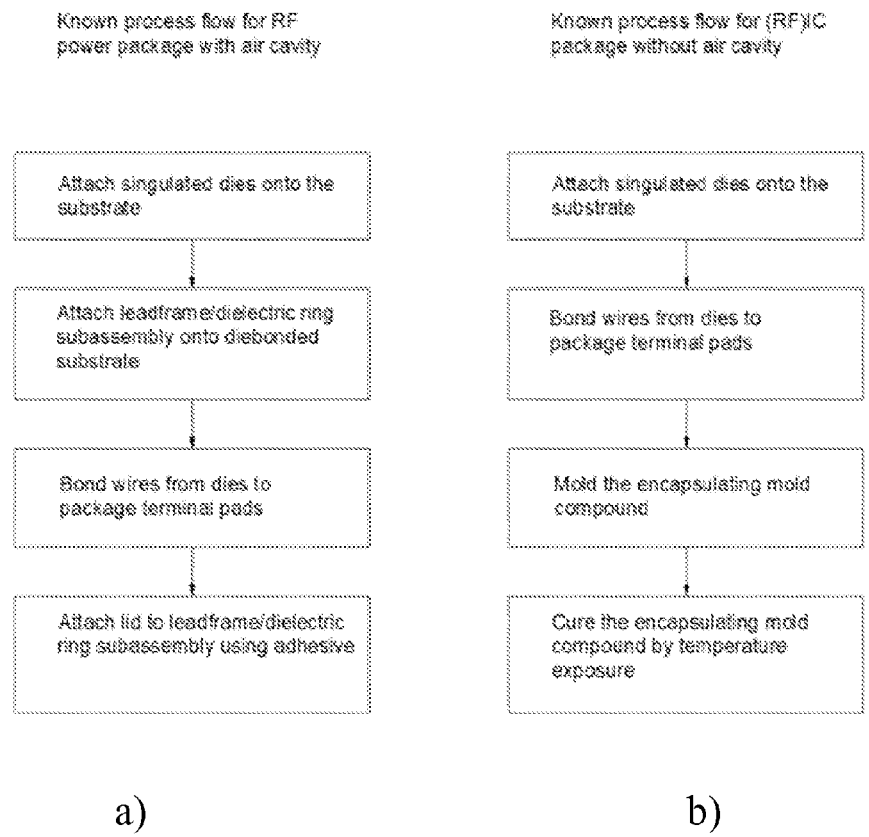
Fig. 3 Known packaging processes
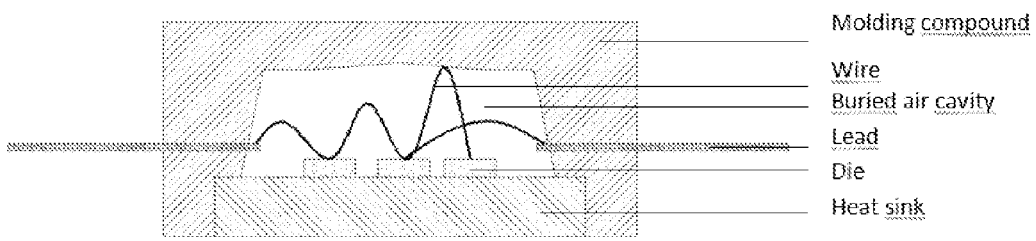
Fig. 4 Overmolded buried air cavity lead-frame based package for RF devices

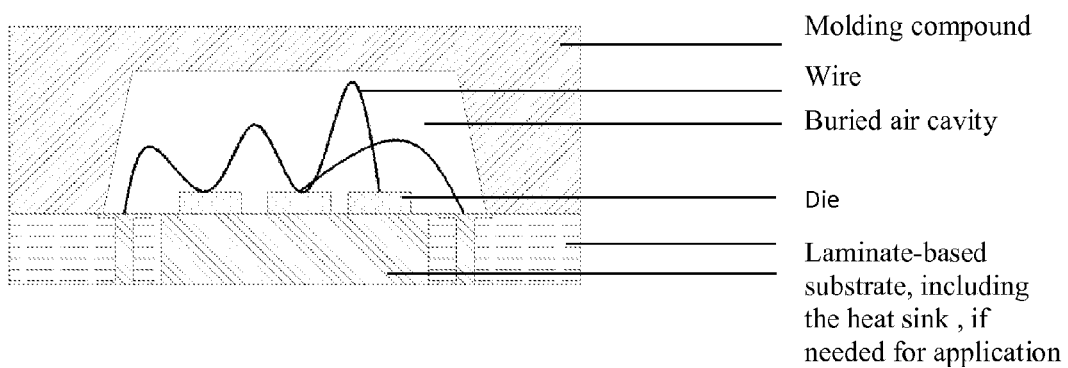
Fig. 5 A laminate-based system in a package with over-molded buried air cavity

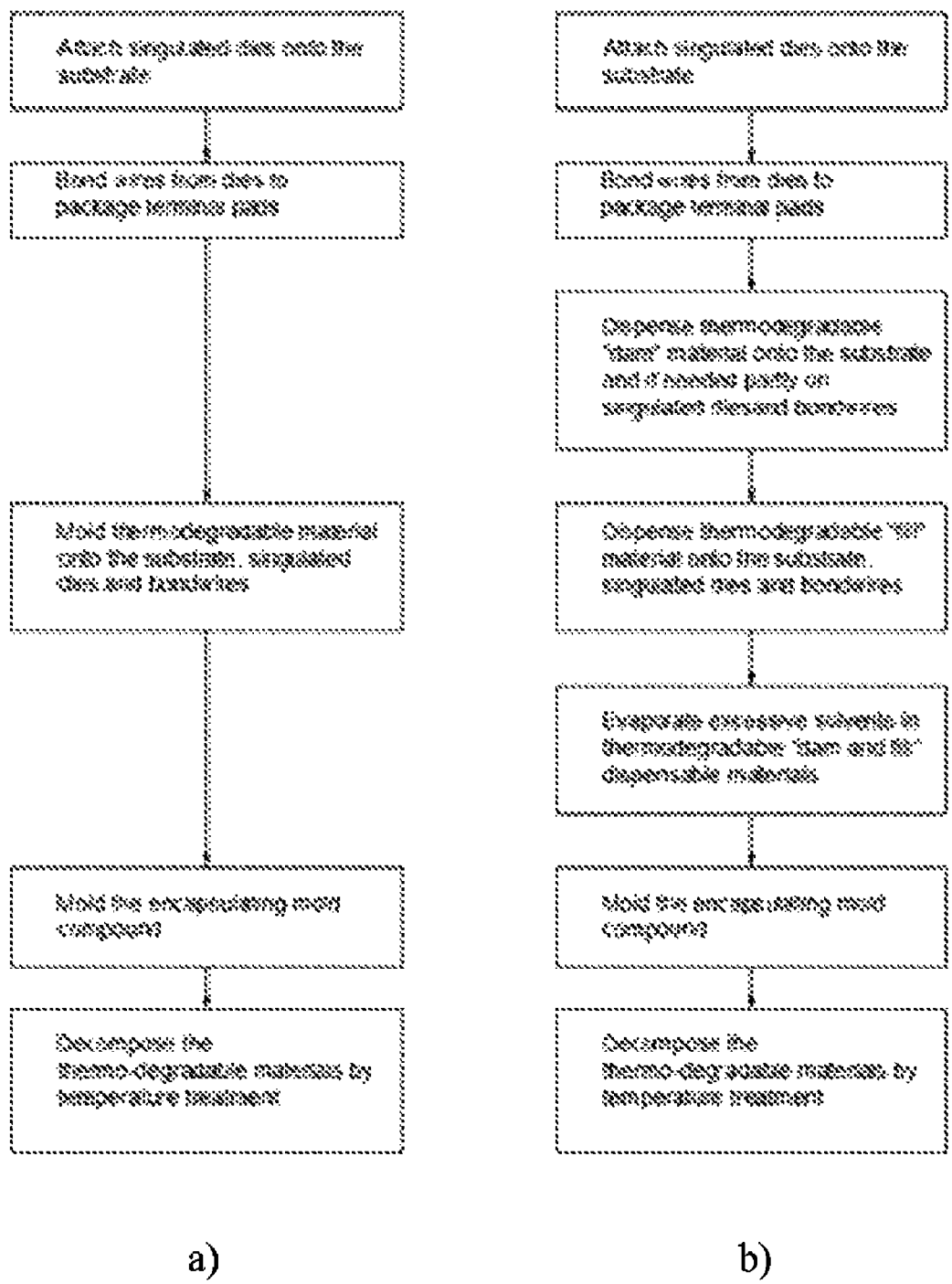
Fig. 6 The packaging process according to the invention

PACKAGE FOR AN INTEGRATED CIRCUIT

CROSS-REFERENCE TO RELATED APPLICATIONS

This application claims the priority under 35 U.S.C. §119 of European patent application no. 12192281.9, filed on Nov. 12, 2012, the contents of which are incorporated by reference herein.

FIELD OF THE INVENTION

The invention relates to a method for packaging an integrated circuit comprising at least a die. The invention also relates to a packaged device obtained according to the method.

BACKGROUND OF THE INVENTION

In Radio Frequency (RF) systems, semiconductor packages for RF amplifiers or RF Integrated Circuits (ICs) are typically made by means of over-molding such that the dies and wires are covered by a mould compound. Examples of this art are the Quad Flat Non-leaded package (QFN), Heat-sink Small Outline Package (HSOP) and Ball Grid Array (BGA) package styles.

Another typical concept for RF packages is an air cavity package. The function of the air cavity is to provide a dielectric with low dielectric relative permittivity e.g. close to 1.0 between the wire loops to create less electrical losses and enhance the performance of the RF product and system.

Air cavity packages are typically built-up by a stack of different materials, which encapsulate semiconductor dies, internal wiring and an air cavity as it is shown in FIG. 1.

For obtaining the structure according to the present application shown in FIG. 4 the so called dam and fill dispensing method is used. For obtaining a standard non-heat-degradable glob top it is necessary a high viscosity material to create a dam and a low viscosity material as encapsulant fluid to fill the "bath tub" within the dam perimeter. In the above method i.e. "dam and fill", the dam is typically a rectangle of epoxy based fluid dispensed as lines or as a complete rectangle onto the substrate of the assembled package or assembled board for encapsulating the dies and the wires. The height of the dam can vary from slightly lower to slightly higher than the height of the parts within the dam perimeter. The width of the dam depends on the type of fluid and height.

The dam material typically needs fillers to increase viscosity. In the known art of "dam and fill" the epoxy based fluids contain fillers, such as silica.

FIG. 3a depicts a common process flow for an RF power amplifier package with air cavity.

FIG. 3b depicts a common process flow for an RF integrated circuit without air cavity.

The figures describing the above methods are self explanatory.

US-A 2007/0273013 provide systems and methods for producing micro electro-mechanical device packages. Briefly described, in architecture, one embodiment of the system, among others, includes a micro electro-mechanical device formed on a substrate layer; and a thermally decomposable sacrificial structure protecting at least a portion of the micro electro-mechanical device, where the sacrificial structure is formed on the substrate layer and surrounds a gas cavity enclosing an active surface of the micro electro-mechanical device. Other systems and methods are also provided.

Because of price erosion in RF products, it is a need for packages for RF products that are cheaper, especially the air cavity packages for RF products. A new package solution based on cheaper materials is needed for an air cavity package for RF products. Throughout the application we shall use the term the "encapsulant material" with the meaning of "the standard (epoxy) mold compound".

SUMMARY OF THE INVENTION

This object can be achieved with a method for packaging an integrated circuit (IC) or RF power amplifier comprising steps of:
attaching at least one die on a substrate;
attaching bond-wires from the die(s) to package terminal pads;
mold or dispense a thermo-degradable material on the substrate, die(s) and bond-wires;
mold the encapsulant material;
decompose the thermo-degradable materials by temperature treatment.

Advantageously, the method may comprise the step of dispensing the thermo-degradable "dam" material on the substrate. The method may further comprise the step of dispensing the thermo-degradable "dam" material situated on the die(s) and on the bond-wires. The method may further comprise the step of dispensing the "fill" material on the substrate, die(s) and bondwires. The method may further comprise the step of evaporating excessive solvents included in the thermo-degradable dispensable materials. Preferably, the thermo-degradable dispensable material has a dielectric constant substantially different than 1. It can be observed that these materials are cheaper than the materials used in the known solution. Among other materials the thermo-degradable dispensable material are thermo-degradable polymers, such as polypropylene carbonate (PPC), polyethylene carbonate (PEC) or other suitable thermo-degradable polymers.

Applying the above-described method, an RF IC or RF power amplifier is obtained. The IC or power amplifier includes
at least one die on a substrate;
at least a bond-wire connected to at least one terminal pad attached to the package;
an air cavity made according to the outlined method.
The height of the air cavity is at least 25 micro-meters and might be, if necessary higher than 1 mm. Preferably, the height of the air cavity is at least 200 micro-meter height.

The invention is defined by the independent claims. Dependent claims define advantageous embodiments.

BRIEF DESCRIPTION OF THE DRAWINGS

The above and other advantages will be apparent from the exemplary description of the accompanying drawings in which FIG. 1 depicts a general air cavity package for a power amplifier;

FIG. 2 depicts a more detailed view of the situation after "dam and fill" dispensing the thermo-degradable material and before molding the encapsulant;

FIG. 3a depicts a common process flow for an RF power amplifier package with air cavity;

FIG. 3b depicts a common process flow for an RF integrated circuit without air cavity;

FIG. 4 depicts an overmolded buried air cavity lead-frame based package for RF devices, according to the invention;

FIG. 5 depicts a laminate-based system in package with overmolded buried air cavity;

FIG. 6a depicts a first packaging process according with an embodiment of the invention; and FIG. 6b depicts a second packaging process according with another embodiment of the invention.

DETAILED DESCRIPTION OF EMBODIMENTS

FIG. 4 depicts an overmolded buried air cavity lead-frame based package for RF devices, according to the invention. The figure comprises a package concept with overmolded buried air cavity for RF products with a cavity higher than 200 μm as an example. The lateral dimensions of the buried air cavity for RF devices can be ranging from a 0.5 mm by 0.5 mm up to 30 mm×30 mm or even larger.

The air cavity packages uses what is called a "dam and fill" dispensing process, which is a known method in semiconductor industry for encapsulating dies and wires on laminate substrates. However, it is not a known process for creating an air cavity, as it will be evident from the present application. FIG. 2 shows a cross-section through a integrated circuit before final encapsulation process. The integrated circuit has been processed so far using the "dam and fill" process.

The buried air cavity can be made by means of a sacrificial insert which can be applied locally onto the dies and wires by different methods, such as, but not necessarily limited to:

a dispensing method such as "dam and fill" (for sample or low volume production) before the standard encapsulant molding process a molding process (for high volume production) before the standard encapsulant molding process.

The sacrificial insert can consist of a heat-degradable polymer, such as polypropylene carbonate (PPC), polyethylene carbonate (PEC) or other suitable polymers. The polymer can be dissolved in a solution to make it suitable for dispensing methods.

To increase the viscosity of the polymer dam material filler particles can be added to the material. The "filler polymer" should be thermo degradable as well, but not soluble in the solvent which will be used to dissolve the "fluid polymer". Filler particle size can be up to a maximum of about 100 micrometer in largest dimension to be compatible with the RF package and assembly constructions.

As an example for the "fluid polymer" PPC can be chosen, while PEC can be chosen as the "filler polymer" with the appropriate solvent, such as acetone. PPC is soluble in acetone, while PEC is not soluble in acetone.

After the over-molding process the sacrificial insert can be decomposed by means of a temperature treatment at temperatures ranging from about 175° C., which is in the same range as the post mold curing temperature for the mold compound or to higher temperatures up to 300° C., which is depending on the actual composition of the sacrificial materials.

The volatile gasses permeate through the mold compound leaving an air cavity as dielectric with low relative permittivity for the dies and wires.

The relevant process steps are depicted in FIG. 6b.

The sacrificial insert has been applied by means of "dam and fill" dispensing. A similar method can be followed using a process in which the sacrificial material has been applied by means of molding for a laminate based system in package as it is shown in FIG. 6a and the obtained device is shown in FIG. 5.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A method for packaging an integrated circuit (IC) comprising steps of:
    attaching at least one die on a substrate;
    attaching bond-wires from the die(s) to package terminal pads;
    providing a thermo-degradable material in direct contact with the substrate, with the at least one die and with the bond-wires;
    molding an encapsulant material that encapsulates the thermo-degradable material, the at least one die, and the bond-wires against the substrate; and
    forming an air cavity between the encapsulant and the at least one die by decomposing the thermo-degradable material by temperature treatment.

2. A method for packaging an integrated circuit as claimed in claim 1 further comprising the step of dispensing the thermo-degradable material on the substrate.

3. An RF integrated circuit or an RF amplifier included in a package formed in accordance with the method of claim 2, the RF integrated circuit or the RF amplifier comprising:
    the at least one die on a substrate;
    for each of the at least one die, at least a bond-wire connected from the die to at least one terminal pad attached to the package; and
    the air cavity formed around the at least one die and the bond-wire by the decomposing of the thermo-degradable material.

4. A method for packaging an integrated circuit as claimed in claim 1 further comprising the step of dispensing the thermo-degradable material situated on the die and on the bond-wires.

5. An RF integrated circuit or an RF amplifier included in a package formed in accordance with the method of claim 4, the RF integrated circuit or the RF amplifier comprising:
    the at least one die on a substrate;
    for each die, at least a bond-wire connected from the die to at least one terminal pad attached to the package; and
    the air cavity formed around the at least one die and the bond-wire by the decomposing of the thermo-degradable material.

6. A method for packaging an integrated circuit as claimed in claim 1,
    wherein molding the encapsulant material includes sealing the thermo-degradable material, the at least one die, and the bond-wires between the encapsulant material and the substrate,
    further comprising the steps of evaporating excessive solvents included in the thermo-degradable material and permeating the decomposed thermo-degradable material and excessive solvents through the encapsulant material with the encapsulant material sealing the thermo-degradable material with the substrate, the at least one die and bond-wires, and
    wherein forming the air cavity includes generating gas and solvent from the thermo-degradable material and permeating the gas and solvent through the encapsulant material while the die and bond wires are sealed by the encapsulant material to the substrate.

7. An RF integrated circuit or an RF amplifier included in a package formed in accordance with the method of claim 6, the RF integrated circuit or the RF amplifier comprising:
the at least one die on a substrate;
for each die, at least a bond-wire connected from the die to at least one terminal pad attached to the package; and
the air cavity formed around the at least one die and the bond-wire by the decomposing of the thermo-degradable material.

8. A method for packaging an integrated circuit as claimed in claim 1 wherein the thermo-degradable material has a dielectric constant substantially different than 1 and is dispensed onto the substrate, the at least one die and the bond-wires.

9. A method for packaging an integrated circuit as claimed in claim 8, wherein the thermo-degradable material is one of the thermo-degradable polymers including: polypropylene carbonate (PPC), polyethylene carbonate (PEC) or other suitable thermo-degradable polymer.

10. An RF integrated circuit or an RF amplifier included in a package formed in accordance with the method of claim 9, the RF integrated circuit or the RF amplifier comprising:
the at least one die on a substrate;
for each die, at least a bond-wire connected from the die to at least one terminal pad attached to the package; and
the air cavity formed around the at least one die and the bond-wire by the decomposing of thermo-degradable material.

11. An RF integrated circuit or an RF amplifier included in a package formed in accordance with the method of claim 8, the RF integrated circuit or the RF amplifier comprising:
the at least one die on a substrate;
for each die, at least a bond-wire connected from the die to at least one terminal pad attached to the package; and
the air cavity formed around the at least one die and the bond-wire by the decomposing of the thermo-degradable material.

12. A method for packaging an integrated circuit as claimed in claim 1 wherein the thermo-degradable material has a dielectric constant substantially different than 1 and is molded onto the substrate, the at least one die and the bond-wires.

13. An RF integrated circuit or an RF amplifier included in a package formed in accordance with the method of claim 12, the RF integrated circuit or the RF amplifier comprising:
the at least one die on a substrate;
for each die, at least a bond-wire connected from the die to at least one terminal pad attached to the package; and
the air cavity formed around the at least one die and the bond-wire by the decomposing of the thermo-degradable material.

14. An RF integrated circuit or an RF amplifier included in a package formed in accordance with the method of claim 1, the RF integrated circuit or the RF amplifier comprising:
the at least one die on a substrate;
for each of the at least one die, at least a bond-wire connected to at least one terminal pad attached to the package; and
the air cavity formed around the at least one die and the bond-wire by the decomposing of the thermo-degradable material.

15. An RF integrated circuit or an RF amplifier as claimed in claim 14, wherein the air cavity has a height of at least 200 micro-meters.

16. The method of claim 1, wherein decomposing the thermo-degradable material includes heating the thermo-degradable material to generate a gas and a solvent in the cavity.

17. The method of claim 1, wherein the cavity is an air cavity and further including forming the air cavity and thermally decomposing the thermo-degradable material into a gas and permeating the gas through the encapsulant material.

18. An RF circuit package comprising:
a die on a substrate;
at least one bond-wire that connects the die to a terminal pad attached to the package;
a thermo-degradable material formed in contact with and around both the die and the at least one bond-wire; and
an encapsulant material that encapsulates and seals the thermo-degradable material, the die, and the bond-wires against the substrate,
the thermo-degradable material being configured and arranged with the encapsulant material to form an air cavity by transitioning into a gas in response to temperature treatment of the RF circuit package, and permeating the gas through the encapsulant material, the air cavity exposing portions of the die and the bond wires having been in contact with the thermo-degradable material via the transitioning of the thermo-degradable material into the gas.

19. A method for packaging an integrated circuit (IC) comprising steps of:
attaching a die on a substrate;
attaching bond-wires from the die to package terminal pads;
providing a thermo-degradable material in contact with the substrate, die and bond-wires;
molding an encapsulant material that encapsulates and seals the thermo-degradable material, the die, and the bond-wires against the substrate; and
forming an air cavity between the encapsulant material and the die by thermally decomposing the thermo-degradable material into a gas and permeating the gas through the encapsulant material, the air cavity exposing portions of the die and the bond wires having been in contact with the thermo-degradable material via the decomposing of the thermo-degradable material into the gas.

* * * * *